(12) United States Patent
Werner et al.

(10) Patent No.: US 8,294,601 B2
(45) Date of Patent: Oct. 23, 2012

(54) DETECTION OF INTENDED KEY ACTIVATION ON A MOBILE DEVICE

(75) Inventors: Colin Mark Werner, Waterloo (CA); Lawrence Edward Kuhl, Waterloo (CA); Keizo Marui, Waterloo (CA); Chao Chen, Waterloo (CA); Ken Wu, Waterloo (SG)

(73) Assignee: Research In Motion Limited, Waterloo, Ontario (CA)

( * ) Notice: Subject to any disclaimer, the term of this patent is extended or adjusted under 35 U.S.C. 154(b) by 505 days.

(21) Appl. No.: 12/617,993

(22) Filed: Nov. 13, 2009

(65) Prior Publication Data
US 2011/0115652 A1 May 19, 2011

(51) Int. Cl.
*H03M 11/00* (2006.01)
(52) U.S. Cl. ............... 341/33; 341/22; 341/31; 341/32; 341/34
(58) Field of Classification Search ............ 341/22, 341/26, 33, 34
See application file for complete search history.

(56) References Cited

U.S. PATENT DOCUMENTS

| | | | | | |
|---|---|---|---|---|---|
| 4,772,874 | A | * | 9/1988 | Hasegawa | 341/26 |
| 4,876,461 | A | * | 10/1989 | Gratke | 307/116 |
| 6,724,324 | B1 | * | 4/2004 | Lambert | 341/33 |
| 6,943,705 | B1 | * | 9/2005 | Bolender et al. | 341/33 |
| 7,106,221 | B2 | * | 9/2006 | Horton et al. | 341/33 |
| 7,151,528 | B2 | | 12/2006 | Taylor et al. | |
| 7,375,656 | B2 | * | 5/2008 | Muller et al. | 341/33 |
| 7,595,788 | B2 | * | 9/2009 | Son | 345/168 |
| 7,609,178 | B2 | * | 10/2009 | Son et al. | 341/33 |
| 7,969,330 | B2 | * | 6/2011 | Philipp | 341/33 |
| 2006/0192690 | A1 | * | 8/2006 | Philipp | 341/33 |
| 2007/0091070 | A1 | | 4/2007 | Larsen et al. | |
| 2007/0256915 | A1 | | 11/2007 | Levy | |
| 2007/0268265 | A1 | * | 11/2007 | XiaoPing | 345/173 |
| 2007/0273561 | A1 | * | 11/2007 | Philipp | 341/33 |
| 2008/0085743 | A1 | | 4/2008 | Klinghult | |

(Continued)

FOREIGN PATENT DOCUMENTS
EP 1109382 A2 6/2001
(Continued)

OTHER PUBLICATIONS

European Patent Application No. 09175999.3, Search Report dated Apr. 8, 2010.

*Primary Examiner* — Linh Nguyen
(74) *Attorney, Agent, or Firm* — Curtis B. Behmann; Borden Ladner Gervais LLP (57) ABSTRACT

A method and device are provided for preventing unintended activation of one or more hard keys on a mobile device. A capacitive sensor senses a capacitance level at a location on the keyboard, to detect whether a hard key is being actuated by a human hand or human skin. If the sensed capacitance level exceeds a key activation capacitance threshold, a key circuit connection is identified as being associated with an intended hard key activation. If the measured capacitance level is within an uncertainty tolerance below the key activation capacitance threshold, a secondary capacitance level is measured at a non-keyboard location. The key circuit connection is identified as being associated with an intended hard key activation when the measured secondary capacitance level exceeds a key activation confirmation threshold. Additional secondary indicators can be obtained based on size and shape capacitance pattern, timing information, and an active application or device state.

13 Claims, 10 Drawing Sheets

U.S. PATENT DOCUMENTS

| | | |
|---|---|---|
| 2009/0008234 A1 | 1/2009 | Tolbert et al. |
| 2009/0160761 A1 | 6/2009 | Moosavi et al. |
| 2009/0163193 A1 | 6/2009 | Fyke et al. |
| 2009/0200148 A1* | 8/2009 | Honmatsu et al. ............ 200/5 A |
| 2010/0214259 A1* | 8/2010 | Philipp et al. ................. 345/174 |
| 2012/0050167 A1* | 3/2012 | Krahenbuhl et al. ......... 345/169 |

FOREIGN PATENT DOCUMENTS

EP   1832963 A2   9/2007

* cited by examiner

DETECTION OF INTENDED KEY ACTIVATION ON A MOBILE DEVICE

FIELD

The present application relates generally to mobile devices. More particularly, the present application relates to the prevention of unintended key presses, which result in actuation or activation of the key.

BACKGROUND

Mobile devices provide users with convenient functions and capabilities relating to communication and organization. Accordingly, many users carry their mobile device with them in a pocket, purse, holster, or other means. It is desirable for a user to keep a mobile device turned on at all times in order to take full advantage of its functionality.

Hard keys on a mobile device can accidently be pushed or actuated while the device is being transported by a user, or when inserted/removed from a carrying case or holster. Users often keep a mobile device keyboard unlocked to permit easy access to the device features, without having to unlock the device for each use. Even when keyboard input is temporarily disabled or locked, some mobile devices permit access to certain functions such as making an emergency call or answering an incoming call.

Accidental actuation of a hard key can have unintended results, such as launching an application or dialing a phone number that was not desired. This can lead a user to believe that the mobile device is not functioning properly, and lead to annoyance or frustration.

BRIEF DESCRIPTION OF THE DRAWINGS

Embodiments will now be described, by way of example only, with reference to the attached Figures, wherein.

DETAILED DESCRIPTION

Generally, the present application provides a method and device for preventing unintended activation of one or more keys on a mobile device. By measuring a capacitance level at the mobile device keypad, a determination is made to distinguish between a human touch and abutment with an object. A capacitive sensor senses a capacitance level at a location on the keyboard, to detect whether a hard key is being actuated by a human hand or human skin. If the sensed capacitance level exceeds a key activation capacitance threshold, a key circuit connection is identified as being associated with an intended hard key activation. If the measured capacitance level is within an uncertainty tolerance below the key activation capacitance threshold, a secondary capacitance level is measured at a non-keyboard location. The key circuit connection is identified as being associated with an intended hard key activation when the measured secondary capacitance level exceeds a key activation confirmation threshold. Additional secondary indicators can be obtained based on size and shape capacitance pattern, timing information, and an active application or device state.

In an embodiment, the present application provides a mobile device including a keyboard, a printed circuit board (PCB), a capacitive sensor and a processor. The keyboard includes a keypad defining a plurality of hard keys. The PCB includes a plurality of key circuits to detect actuation of the plurality of hard keys. The capacitive sensor is provided between the keypad and the printed circuit board and arranged to detect a capacitance level on the keypad. The processor is arranged to identify an intended hard key activation in response to receiving an indication of connection of one of the plurality of key circuits, and when a detected capacitance level on the keypad exceeds a key activation capacitance threshold.

The mobile device can further include a light shielding capacitive sensing film providing back light shielding and capacitance detection. The capacitive sensor can be provided on a surface of the light shielding capacitive sensing film. The capacitive sensor provided on the light shielding capacitive sensing film can be implemented by way of a conductive coating. The conductive coating can include an x-channel coating provided on one side of the light shielding capacitive sensing film, and a y-channel coating provided on another side of the light shielding capacitive sensing film. In an embodiment, the x-channel coating is provided on a keyboard-facing side of the light shielding capacitive sensing film, and the y-channel coating is provided on a PCB-facing side of the light shielding capacitive sensing film.

The mobile device can further include a housing, and a secondary capacitive sensor disposed at a non-keyboard location on the mobile device and arranged to detect a secondary capacitance level at the non-keyboard location. The non-keyboard location can be a location on an outer face of the housing. The processor can be arranged to compare the measured secondary capacitance level at the non-keyboard location to a key activation confirmation threshold, and to identify the key circuit connection as being associated with an intended hard key activation when the measured secondary capacitance level exceeds the key activation confirmation threshold.

In an example, the key activation capacitance threshold can be about 2 pico Farads greater than a base capacitance, the base capacitance being measured in the absence of actuation of one of the plurality of hard keys by human skin.

In another embodiment, the present disclosure provides a method of identifying an intended hard key actuation on a mobile device. The mobile device has a keyboard including a keypad defining a plurality of hard keys, and a printed circuit board including a plurality of key circuits to detect actuation of the plurality of hard keys. The method includes the following steps: receiving an indication of connection of a selected one of the plurality of key circuits associated with a selected one of the plurality of hard keys; obtaining a measured capacitance level at a keyboard location near the selected hard key; comparing the measured capacitance level at the keyboard location to a key activation capacitance threshold; and identifying the key circuit connection as being associated with an intended hard key activation when the measured capacitance level exceeds the key activation capacitance threshold.

The method can further include intercepting the key circuit connection before an associated input is passed to an active application. The method can further include processing an input associated with the actuation of the selected hard key.

In another embodiment, the present application provides a computer-readable medium storing statements and instructions for execution by a processor to perform the method of identifying an intended hard key actuation on the mobile device as described herein.

If the measured capacitance level is within an uncertainty tolerance below the key activation capacitance threshold, the method can further include the following steps: obtaining a measured secondary capacitance level at a non-keyboard location of the mobile device; comparing the measured secondary capacitance level at the non-keyboard location to a key activation confirmation threshold; and identifying the key circuit connection as being associated with an intended hard key activation when the measured secondary capacitance level exceeds the key activation confirmation threshold.

Figure 1:
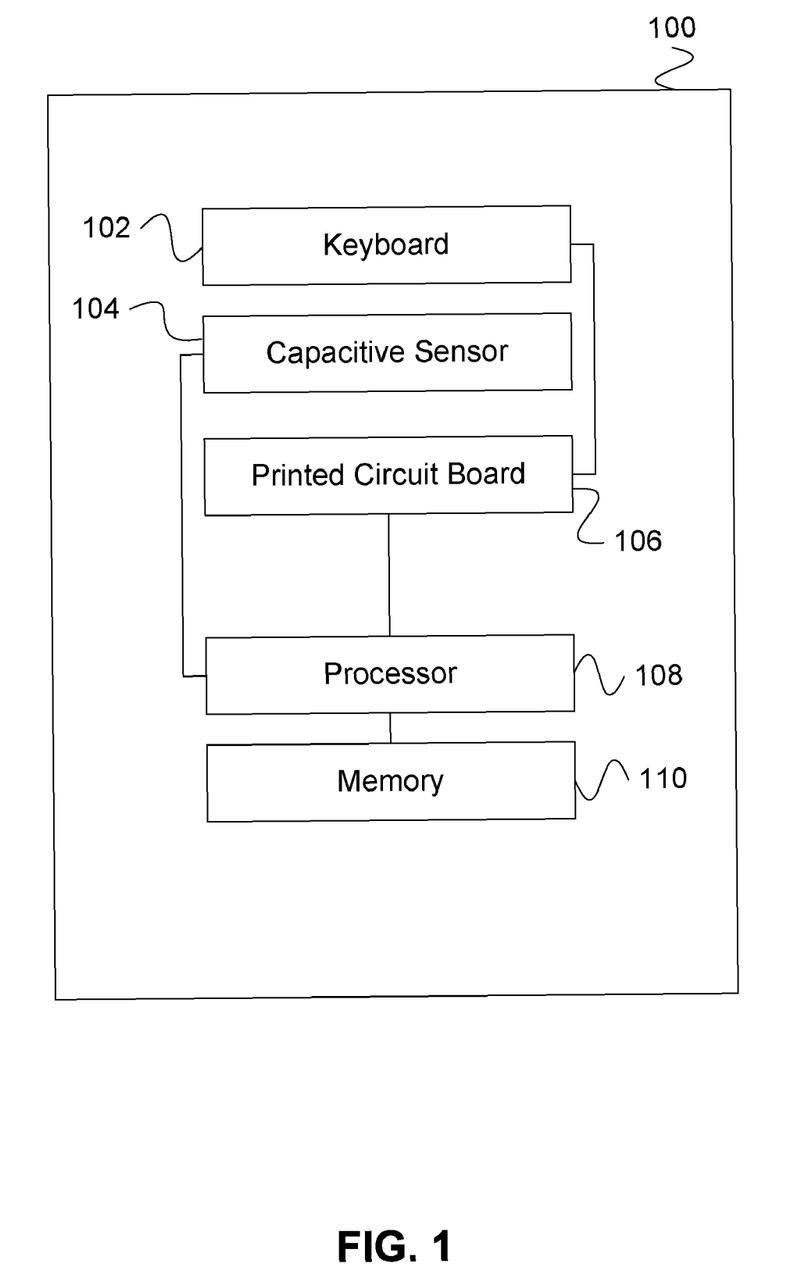
FIG. 1 illustrates a block diagram of a mobile device arranged to identify an intended key activation according to an embodiment of the present application.

FIG. 1 illustrates a block diagram of a mobile device arranged to identify an intended key activation according to an embodiment of the present application. The mobile device 100 includes a keyboard 102, a capacitive sensor 104, and a printed circuit board (PCB) 106. As illustrated with respect to FIG. 3, the keyboard 102 includes a keypad 124 defining a plurality of hard keys, or key caps, 126. Referring back to FIG. 1, the printed circuit board 106 includes a plurality of key circuits to detect actuation of the plurality of hard keys. The capacitive sensor 104 is provided between the keypad of the keyboard 102 and the printed circuit board (PCB) 106 and is arranged to detect a capacitance level on the keypad. Some known approaches provide a layer of capacitive film on the keypad, but this is for gesture-based navigation or identification of finger moving, not for addressing the issue of keys accidental activation.

The capacitive sensor 104 senses a change in capacitance between the sensor and ground. In embodiments described herein, the capacitive sensor is used to distinguish between intended and unintended key activations. This is based on the understanding that an intended key activation will be the result of human skin touching the keyboard 102, such as by typing with a user's fingers or thumbs. Capacitive sensing does not require direct contact. For example, a capacitive sensor used with a touch screen device can be provided underneath a glass surface of a display and still provide capacitive sensing capabilities. In an embodiment, the capacitive sensor 104 can sense if a human finger is within about 1 mm of the sensor. Most capacitive sensors cannot sense a change in capacitance if the finger is more than about 2 mm away from the sensor.

The mobile device 100 further includes a processor 108 arranged to identify an intended hard key activation. In known mobile devices, a processor identifies a hard key activation based simply on a corresponding key circuit on the PCB being connected. The processor 108 is arranged to identify an intended hard key activation in response to receiving an indication of connection of a key circuit, and when a detected capacitance level on the keypad exceeds a key activation capacitance threshold. According to an embodiment, after detecting connection of a key circuit, the basic determination performed is whether the measured capacitance is high enough above the base, or unactivated, capacitance level to trigger an intended key activation determination. This capacitance level is referred to herein as a key activation capacitance threshold.

In an embodiment, a memory 110, such as a computer-readable memory, is in communication with the processor 108 and stores statements and instructions for execution by the processor to identify an intended hard key activation in response to receiving an indication of connection of a key circuit, and when a detected capacitance level on the keypad exceeds a key activation capacitance threshold.

The capacitive sensor 104 can measure a capacitive difference and profile the measured value with respect to a stored base capacitance, the base capacitance being the capacitive difference measured in the absence of actuation of a key by human skin. The key activation capacitance threshold can be defined as the sum of the base capacitance and a human touch capacitance value. In an example, the key activation capacitance threshold can be defined in relative terms as being about 2 picofarads greater than the base capacitance, where the human touch capacitance value is about 2 picofarads. In other words, when a human finger is present, the capacitance change, or difference, is about 2 pF in this example. The value of the human touch capacitance value may be lower if the insulation layer is thicker.

Figure 3:
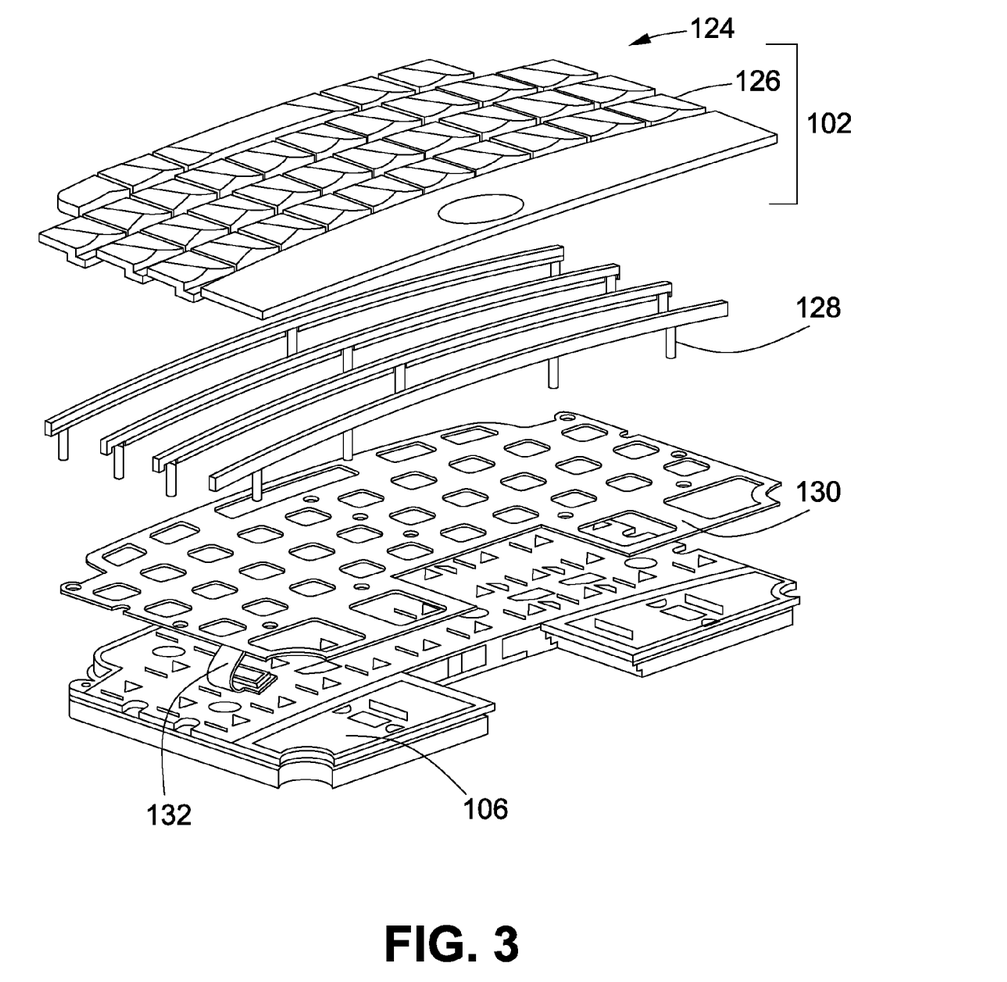
FIG. 3 illustrates an exploded view of elements of a mobile device according to an embodiment of the present application including a capacitive sensor provided on a light shielding film.

An advantage of positioning the capacitive sensor 104 below the keycaps 126 and above the PCB 106 is mechanical integrity. Such a positioning provides a more durable implementation, as the capacitive sensor is protected and would not wear down as quickly. In an embodiment, the capacitive sensor film is provided close to the keycaps to yield improved sensing capability.

If the capacitive sensor 104 is provided on top of the keypad, the shape of the hard keys may need to be changed. In an embodiment, the capacitive sensor can comprise a separate capacitive sensor on each key. Alternatively, the entire keypad surface could be constructed with a capacitance capability.

The capacitive sensor 104 can be designed to detect a location of human touch within a particular area on the keyboard 102. Different sensor designs and sensitivities can be used depending on the desired accuracy of touch identification. For example, the capacitive sensor 104 can include a single capacitive pad to detect the presence of a human finger, or human skin. In an embodiment, the capacitive sensor 104 can include a plurality of capacitive sensors arranged to detect the presence of a human finger or human skin, and to provide a secondary indicator, which will be described later in detail. In an example, the capacitive sensor 104 can include a 2×3 matrix of capacitive pads. In an embodiment, touch location accuracy can be secondary to a simple detection of a human finger touching the keypad somewhere.

Figure 2:
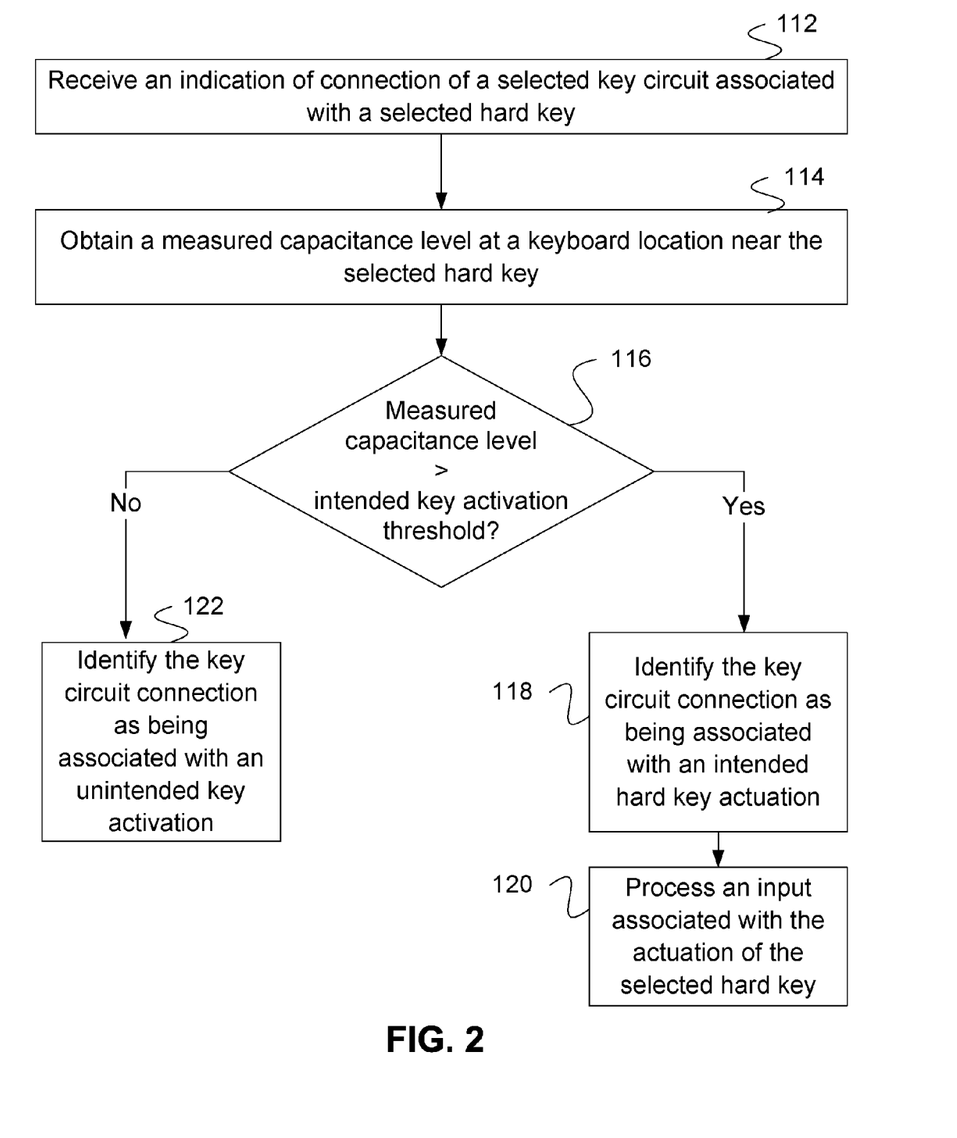
FIG. 2 is a flowchart illustrating a method of identifying an intended key activation on a mobile device according to an embodiment of the present application.

FIG. 2 is a flowchart illustrating a method of identifying an intended key activation on a mobile device according to an embodiment of the present application. As discussed above, the mobile device 100 has a keyboard 102 including a keypad 124 defining a plurality of hard keys 126, and a printed circuit board 106 including a plurality of key circuits to detect actuation of the plurality of hard keys. The method includes the following steps: receiving an indication of connection of a selected key circuit associated with a selected hard key (112); obtaining a measured capacitance level at a keyboard location near the selected hard key (114); comparing the measured capacitance level at the keyboard location to a key activation capacitance threshold (116); and identifying the key circuit connection as being associated with, or caused by, an intended hard key activation when the measured capacitance level exceeds the key activation capacitance threshold (118).

When a key event is received, an embodiment of the present application can obtain information regarding capacitance values when a key is pressed. For example, in response to a detected key circuit connection, a matrix of information at a snapshot in time can be provided, including capacitance information.

In optional step 120, an input associated with the actuation of the selected hard key is processed, such as by sending the input to an active application.

If the comparison in step 116 determines that the measured capacitance level is not greater than the intended key activation threshold, the method proceeds in step 122 to identify the key circuit connection as being associated with, or caused by, an unintended key activation. In that case, the key circuit connection is ignored and no action is taken.

In an embodiment, the method includes the step of intercepting the key circuit connection before an associated input is passed to an active application. As such, the method includes a decision-making utility that sits between the applications and the hard key press to intercept the key and determine whether the key press was intended.

In an embodiment, a mobile device user is given the capability of turning off the measurement of capacitance and the associated determinations. For example, if the user is using gloves or mittens while activating keys, or not using fingers to activate the keys, this would not result in a capacitance change. In an example, an easily accessed way is provided to switch this feature on and off, such as by using a keyboard shortcut. In another example, if a plurality of successive determinations of an unintended key activation are made within a short time period, a popup message can appear on a display of the mobile device advising the user that the key-presses are not being interpreted as intended key activations.

FIG. 3 illustrates an exploded view of elements of the mobile device 100 according to an embodiment of the present application including a capacitive sensor provided on a light shielding film. The elements include a keyboard 102 having a keypad 124 defining a plurality of keycaps 126, a plurality of frets or decoration bars 128, a printed circuit board 106, and a light shielding capacitive sensing film 130. Some known mobile devices include a light shielding film to prevent light leakage. In this embodiment, the light shielding capacitive sensing film 130 is provided, with both functions of back light shielding and identification of human finger pressing by way of capacitance detection.

The light shielding capacitive sensing film 130 can be designed using a capacitance sensitive film in order to provide both functions, and is an exemplary implementation of the capacitive sensor 104. A connector 132 provides electrical connection between the light shielding capacitive sensing film 130 and the PCB 106.

Figure 4:
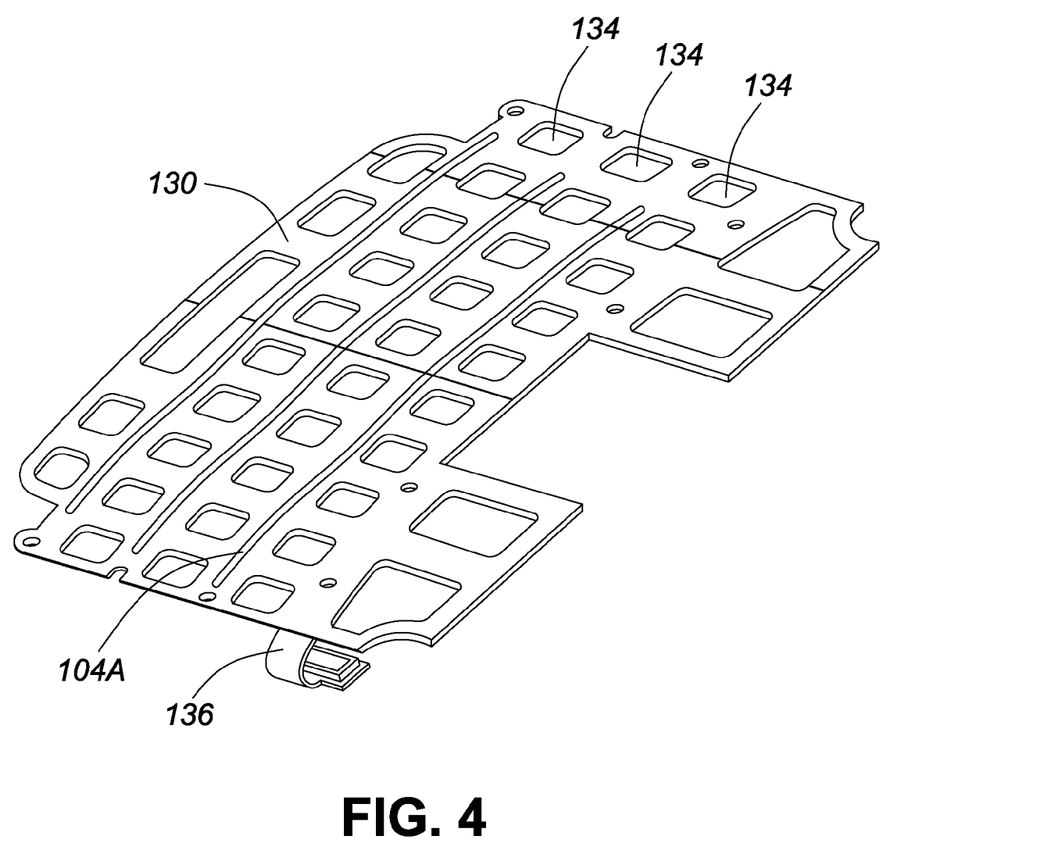
FIG. 4 illustrates a top view of the light shielding film having a capacitive sensor as shown in FIG. 3.
Figure 5:
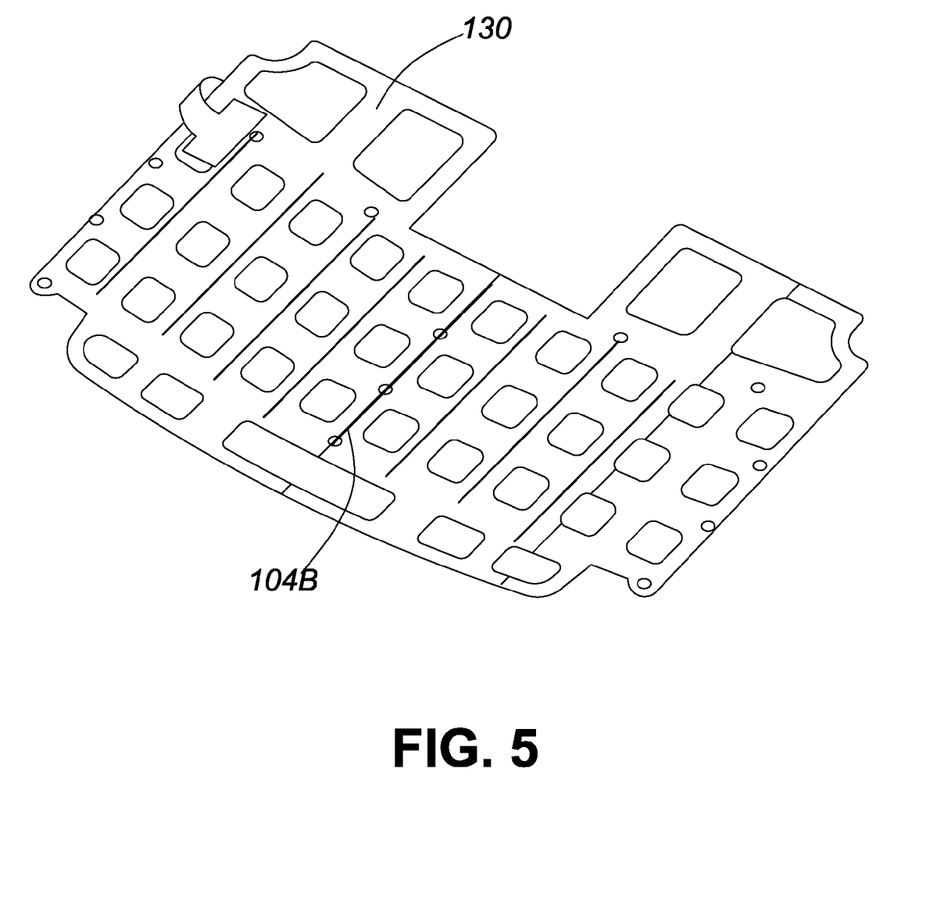
FIG. 5 illustrates a bottom view of the light shielding film having a capacitive sensor as shown in FIG. 3.

FIGS. 4 and 5 illustrate top and bottom views, respectively, of an embodiment of the light shielding capacitive sensing film 130 as shown in FIG. 3, and further including a capacitive sensor 104, shown as 104A and 104B. A typical light shielding capacitive sensing film 130 is implemented using a PET or other plastic material. According to an embodiment of the present application, the capacitive sensor 104 provided on the light sensing shield 130 is implemented by way of a conductive coating 104A or 104B, or both.

In an embodiment, the conductive coating can comprise two conductive coatings: an x-channel coating and a y-channel coating, which co-operate to form a matrix. As shown in FIG. 4, the x-channel coating 104A can be provided on a top, or keyboard-facing side, of the light shielding capacitive sensing film 130. As shown in FIG. 5, the y-channel coating 104B can be provided on a bottom, or PCB-facing side, of the light shielding capacitive sensing film 130. In a particular embodiment, the capacitive sensor 104 on the light shielding capacitive sensing film 130 has a number of x-channels 104A and a number of y-channels 104B, to determine the exact location of capacitive difference using a matrix. In another embodiment, the use of only a x-channel capacitive sensor 104A can obtain a one dimensional location of the capacitive difference.

Such conductive coatings are newly introduced for use in conjunction with keyboard-based devices according to an embodiment of the present application. The conductive coating can be implemented as a layer of electrodes. The layer of electrodes can include a number of rows, or columns, of electrodes. For example, the x-channel coating 104A in FIG. 4 comprises a plurality of x-channel rows, while the y-channel coating 104B in FIG. 5 comprises a plurality of y-channel columns. The electrodes can be added to the light shield using a printing process. In an embodiment, electrodes can be placed in keypad areas that are frequently unintentionally activated, such as on the outer edges of the keypad 124.

In an example embodiment, the light shielding capacitive sensing film 130 can include one or more of the following features. The film 130 can be located between the keyboard keycaps 126 (shown in FIG. 3) and a light guide, with the keycaps providing protection to the film 130 (to avoid wear off or damages to the film). The film can define a plurality of keycap stem apertures 134 (shown in FIG. 4) through which keycap stems can protrude for transmitting keycap pressing forces to keypad domes (not shown) on the PCB.

The film 130 can be designed having an opaque color, such as black, for light shielding. The bottom, or PCB-facing, surface of the film can be designed/painted with a white color for better reflection of the light back into the light guide.

The film 130 can be attached to the keypad light guide by adhesive or printed glue in selective area for better tactile feedback of the keys. The film can be electrically connected to the device main PCB 106 by way of the connector 132 as shown in FIG. 3.

Figure 6:
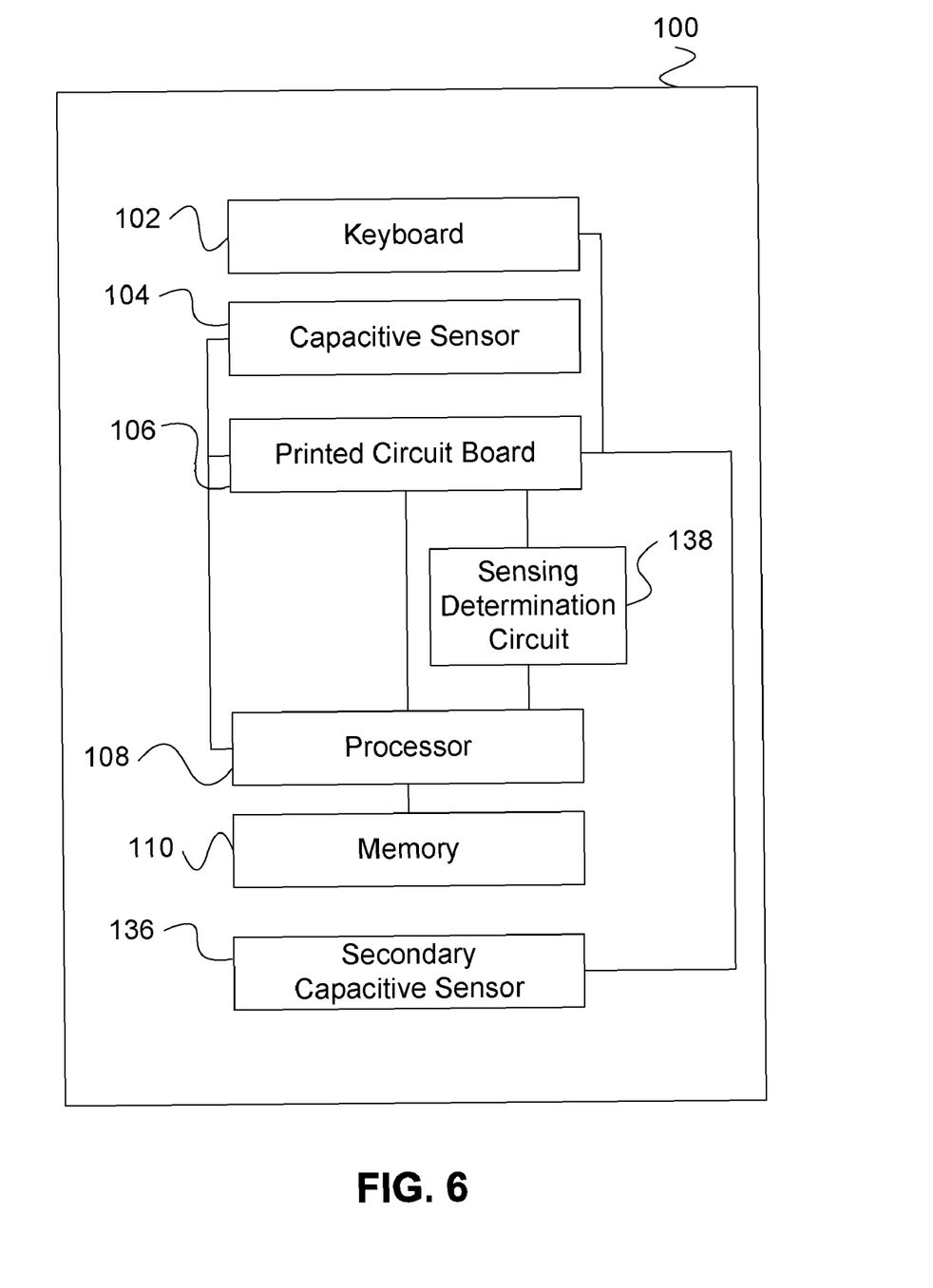
FIG. 6 illustrates a block diagram of a mobile device arranged to identify an intended key activation according to another embodiment of the present application.

FIG. 6 illustrates a block diagram of the mobile device 100 arranged to identify an intended key activation according to another embodiment of the present application. The block diagram of FIG. 6 is similar to the block diagram of FIG. 1, with similar elements being represented with the same reference numerals. A secondary capacitive sensor 136 is provided in the mobile device of FIG. 6 in order to obtain an additional capacitance measurement, to increase confidence in a detection of an intended key press. When the secondary capacitive sensor 136 is provided in the mobile device 100, the capacitive sensor 104 can be referred to as the primary capacitive sensor. A secondary capacitance measurement taken at the secondary capacitive sensor 136 is intended to measure whether the mobile device 100 is being held or supported by a human hand or finger. This can advantageously remove uncertainty if the measured capacity at the keyboard location is slightly below or above the threshold.

The secondary capacitive sensor 136 is provided at a non-keyboard location on the mobile device. In an embodiment, the mobile device 100 can include a plurality of secondary capacitive sensors 136. For example, the secondary capacitive sensor 136 can be provided at one or more non-keyboard locations, including: on the back of a housing of the mobile device; on one or more sides or edges of the mobile device housing; on one or more side grips of the mobile device; on the battery door (FIGS. 8-11). In another example, the secondary capacitive sensor 136 can be implemented as a capacitive sensor, a capacitive film, or a piece of metal.

A sensing determination circuit 138 is provided to detect whether the secondary capacitive sensor 136 has had touch contact with human hand/fingers. This detection can be made based on a voltage change on the sensing determination circuit. The sensing determination circuit 138 can be provided in electrical communication with the PCB 106 and the secondary capacitive sensor 136. Alternatively, the sensing determination circuit 138 can be provided as part of the PCB 106, or as part of the processor 108 to perform the sensing determination.

Figure 7:
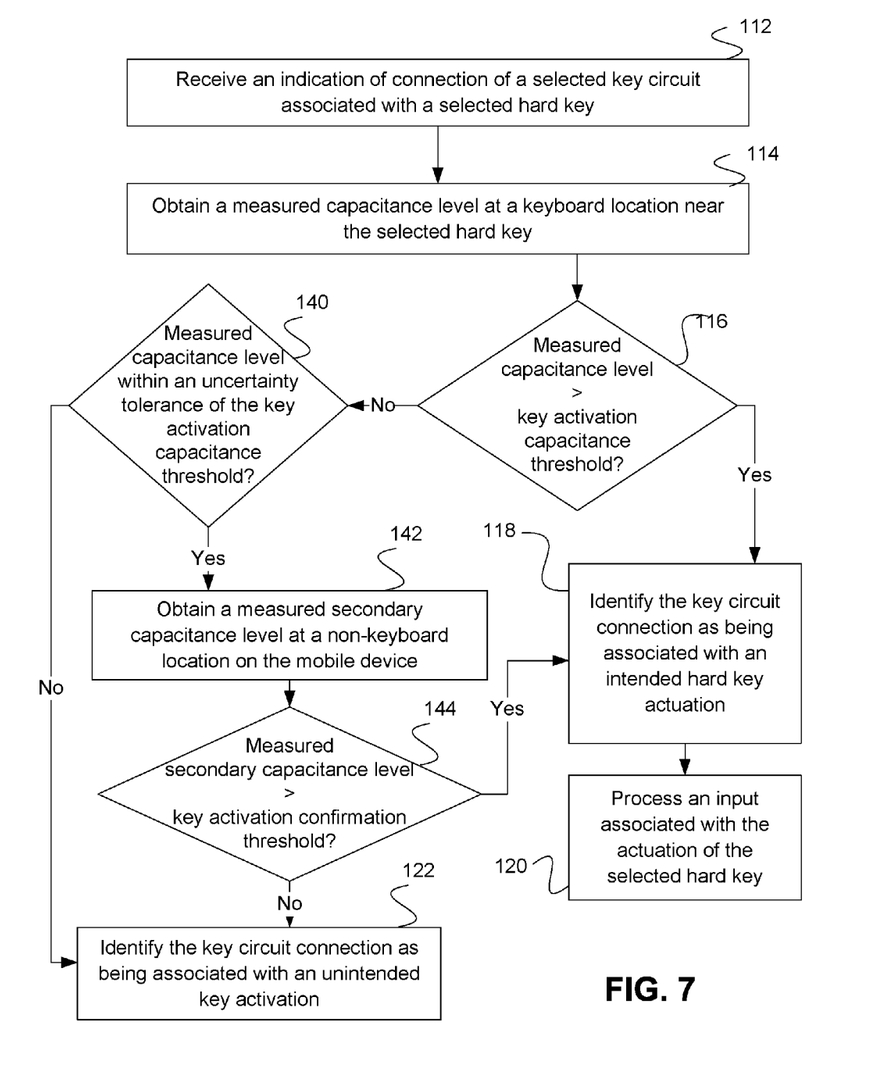
FIG. 7 is a flowchart illustrating a method of identifying an intended key activation on a mobile device according to another embodiment of the present application.

FIG. 7 is a flowchart illustrating a method of identifying an intended key activation on the mobile device according to another embodiment of the present application. The method in FIG. 7 is similar to the method shown in FIG. 2, with additional steps and some different flows. After step 116, a determination is made in step 140 as to whether the measured capacitance level is within an uncertainty tolerance of the key activation capacitance threshold. If not, the method proceeds to step 122 to identify the key circuit connection as being associated with an unintended key activation.

If yes, the method proceeds in step 142 to obtain a measured secondary capacitance level at non-keyboard location of the mobile device, such as at or near an outer surface of a housing of the mobile device. In step 144, the measured secondary capacitance level at the non-keyboard location is compared to a key activation confirmation threshold. If the measured secondary capacitance level exceeds the key activation confirmation threshold, then the method proceeds to step 118 and identifies the key circuit connection as being associated with an intended hard key activation.

The key activation confirmation threshold used in relation to the secondary capacitance level is different from the key activation capacitance threshold used in relation to the capacitance level obtained at a keyboard location.

Therefore, the secondary capacitive sensor(s) 136 provide added reliability, and improved confidence, to the determination made using the primary capacitive sensor 104 located at the front keypad. If the value received on the front or primary capacitive sensor 104 is in a "grey" zone, where the sensed value is below the key activation capacitance threshold, the secondary (side/back) sensors 136 can be used to increase the confidence in detecting whether it is an intended keypress. If there is a "yes" detection on the front and no detection on the side, this is still a valid keypress. If there is a "maybe" detection on the front, then defer to side/back sensing result to resolve ambiguity, as described above in relation to FIG. 7.

In another embodiment, the method can include a further step (not shown) of obtaining a secondary indicator to assist in identifying an intended hard key activation based on a detected capacitance level, in addition to determining whether the keypad exceeds a key activation capacitance threshold. In an embodiment, the step of obtaining the secondary indicator can be performed after step 116 in FIG. 7. In another embodiment, the step of obtaining the secondary indicator can be performed instead of, before, or after step 140 and its associated subsequent steps.

For example, to distinguish fingers and unintended keys from other objects, as part of obtaining the secondary indicator, the processor 108 can detect the shape or pattern of the area of capacitive contact and determine if it is consistent with an area of contact resulting from human input. A library of human input contact areas can be stored in the computer readable memory 110. The comparison can be based on one or more parameters associated with the area of capacitive contact, including shape and size, to distinguish an unintended key activation from an intended key press.

The secondary indicator can include an indication of where else on the keyboard the increased capacitance is sensed. As described earlier, the method can correlate the capacitance to the location of the key that was pressed, making sure that they indicate a causal relationship.

In the case of rapid typing on a mobile device keyboard, the capacitive sensor 104 will sense fast movement of capacitance changes and key circuit connections. Embodiments of the present application advantageously analyze a key press taking into account timing information. The gate logic on whether to let the key event go through or not, would preferably have a time sensitivity. In an embodiment, it could be an instantaneous check of the capacitance. For rapid typing, an accumulator can be included that then decays off.

The secondary indicator can be obtained from a source other than the detected capacitance level, or parameters relating thereto. For example, a detection of an active application can be used to further determine whether a key activation is intended. For instance, if an email application is open, and if a message is being composed, this information can be used to increase confidence in response to a capacitance detection that is within an uncertainty tolerance of a key activation capacitance threshold.

In another example, a current device state can be used as a secondary indicator. For example, if the device state is "incoming call received", then the expected key presses are limited to certain keys, namely the keys that are assigned to answer or ignore the call. If a received key circuit connection is associated with a key that is not one of the frequently accessed keys associated with the current device state, this can be used to determine that the key press was unintended.

FIGS. 8, 9, 10 and 11 illustrate a mobile device including secondary capacitive sensors 136 according to an embodiment of the present application.

Figure 8:
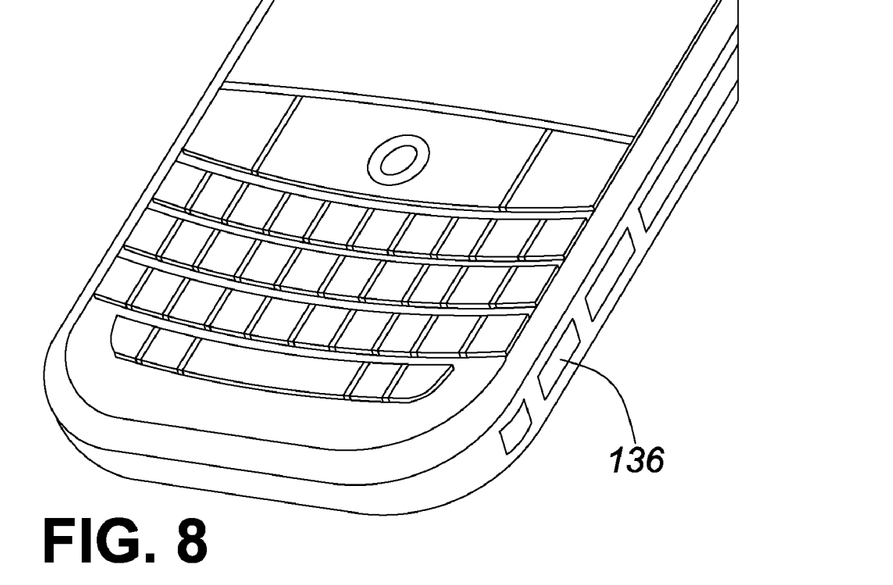
FIGS. 8, 9, 10 and 11 illustrate a mobile device including secondary capacitive sensors according to an embodiment of the present application.
Figure 9:
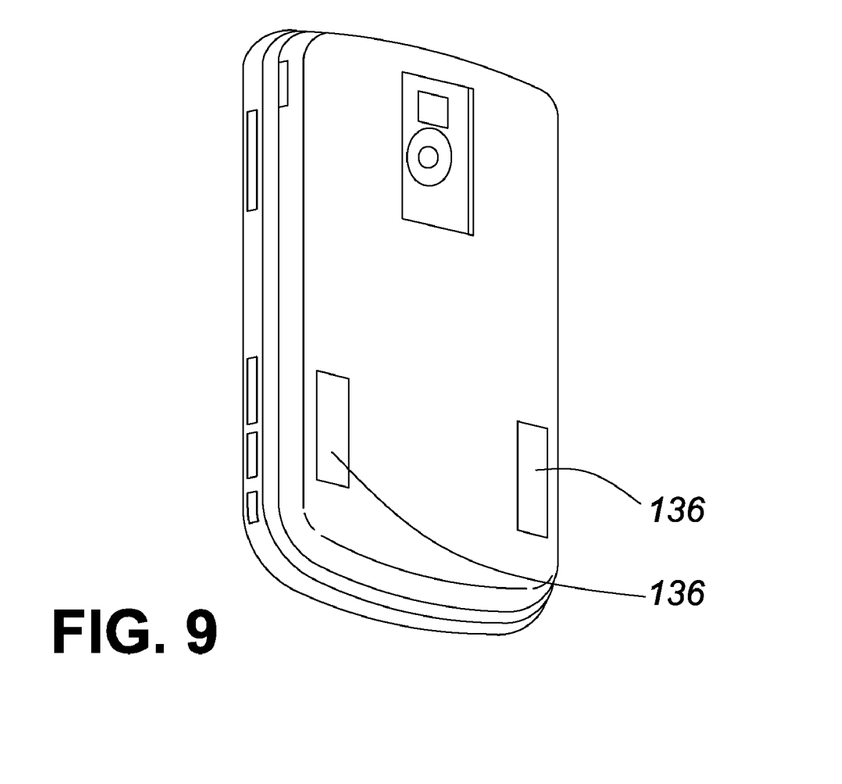

In the embodiments of FIGS. 8 and 9, the secondary capacitive sensor 136 is provided as one or more conductive pads, such as exposed metal pads, connected to the main PCB. FIG. 8 shows the non-keyboard location for the secondary capacitive sensor 136 as being on a side grip of the mobile device. FIG. 9 shows the non-keyboard location for the two secondary capacitive sensors 136 as being on a rear face of the housing. In these embodiments, the PCB can include a sensing determination circuit 138 (shown in FIG. 6) to detect whether the pad(s) were touched by human hand/fingers. This detection can be made based on a resistance change on the sensing determination circuit. Alternatively, the processor can be arranged to perform the sensing determination.

Figures 10, 11:
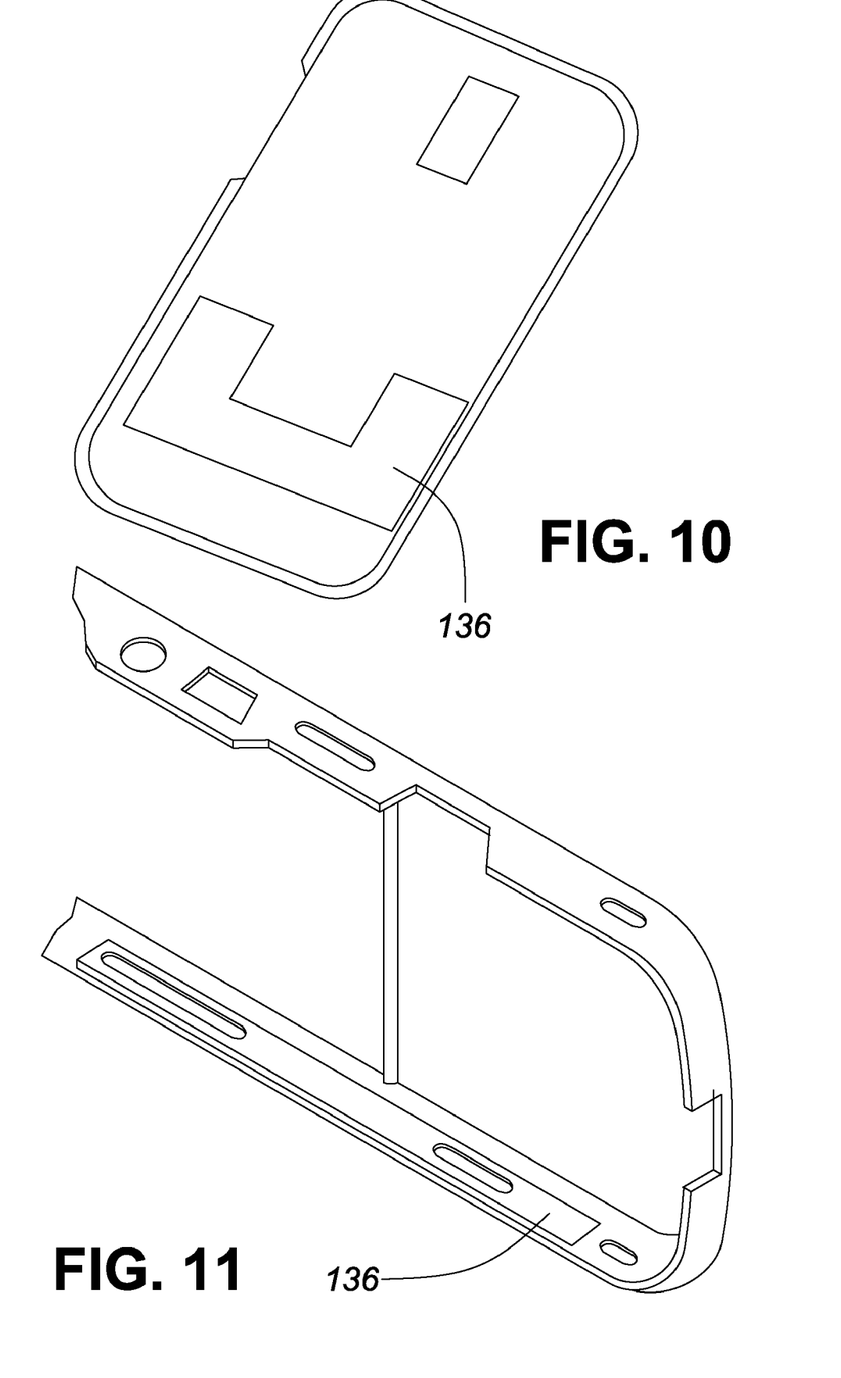

In the embodiment of FIG. 10, the secondary capacitive sensor 136 is provided as one or more flexible secondary PCBs or capacitive sensor films which are placed on the housing surface or on the inner surface of the rear face of the housing (and/or battery door and/or side grips). The flexible secondary PCB can be electrically connected to main PCB, or to a separate circuit board in the mobile device. In this embodiment, the main PCB includes a sensing determination circuit 138 (shown in FIG. 6) to detect the capacitance changes on the capacitor which is formed by the flexible secondary PCB and a human hand/palm. Alternatively, the processor can be arranged to perform the sensing determination.

In the embodiment of FIG. 11, the secondary capacitive sensor 136 is provided as one or more flexible PCBs or pieces of capacitive sensor film, placed on the housing surface or on the inner surface of the rear face of the housing (and/or battery door and/or side grips). In another embodiment, the flexible PCB or capacitive sensor film can be embedded, or co-molded, into the rear housing or the battery door. The flexible PCB/capacitive sensor film can be electrically connected to the main PCB, or to a separate circuit board in the mobile device. In this embodiment, the main PCB includes a sensing determination circuit 138 (shown in FIG. 6) to detect the capacitance changes when a human hand/palm holds the device. Alternatively, the processor can be arranged to perform the sensing determination.

Some users employ a form-fitting protector, also known as a "skin", for their mobile device. In contrast to a holster or case, the skin is not typically removed, but is kept on the mobile device at all times. The use of a form-fitting mobile device protector may impede the detection of a human hand touching the mobile device, if the protector is thick enough. Therefore, in an embodiment (not shown), a form-fitting mobile device protector can include a remote secondary capacitive sensor, in communication with the secondary capacitive sensor on the mobile device, to transmit a sensed capacitance value on an exterior surface of the protector.

Figure 12:
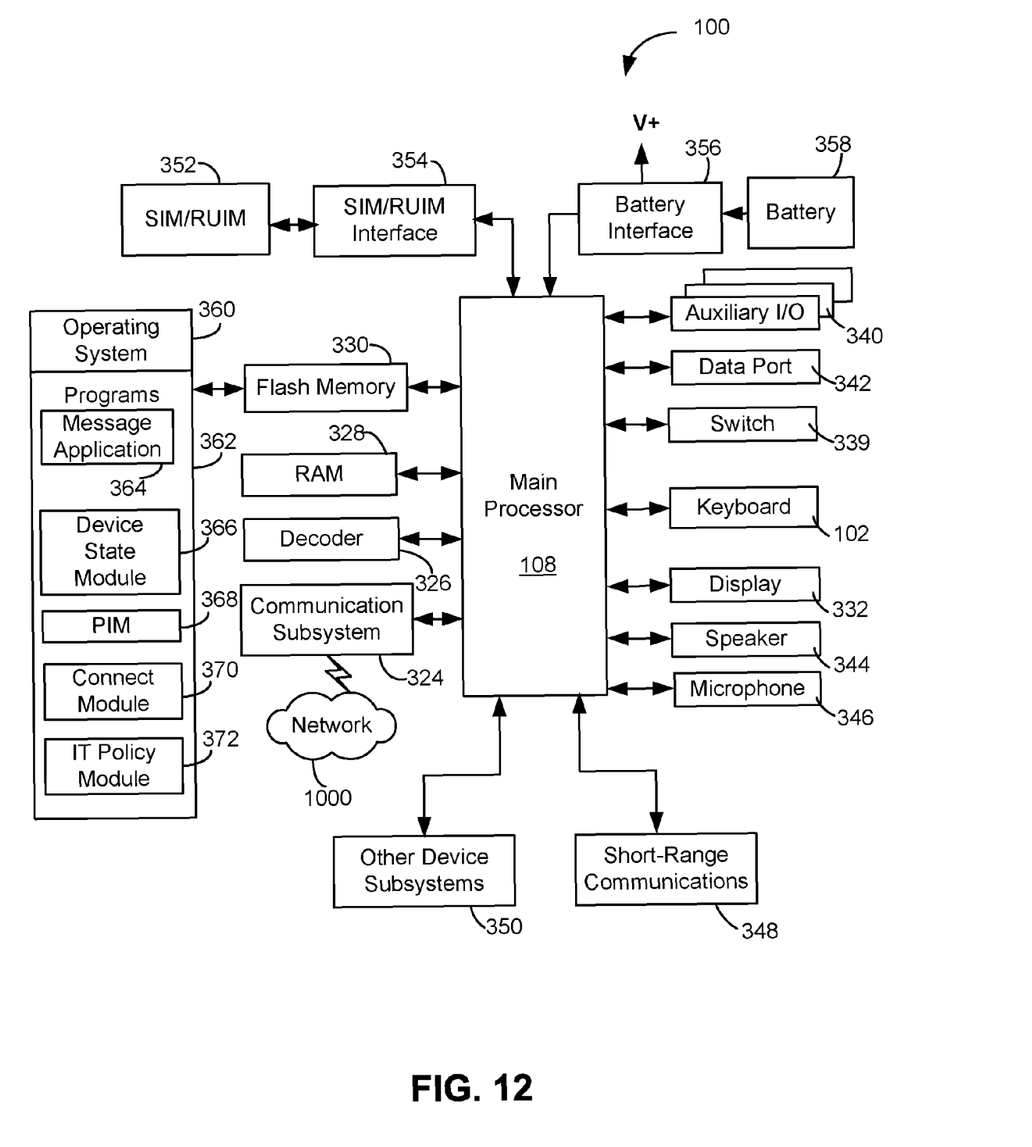
FIG. 12 is a block diagram of a mobile electronic device according to one example.

FIG. 12 is a block diagram of the mobile electronic device according to one example. The following describes in further detail an exemplary mobile electronic device that can include a processor, and a computer readable memory in communication with the processor. In an embodiment, the memory can store statements and instructions for execution by the processor to identify an intended hard key activation in response to receiving an indication of connection of a key circuit and based on one or more detected capacitance levels, as described and illustrated in the present application. The mobile electronic device may be a two-way communication device with advanced data communication capabilities including the capability to communicate with other mobile electronic devices or computer systems through a network of transceiver stations. The mobile electronic device may also have the capability to allow voice communication. Depending on the functionality provided by the mobile electronic device, it may be referred to as a data messaging device, a two-way pager, a cellular telephone with data messaging capabilities, a wireless Internet appliance, or a data communication device (with or without telephony capabilities). The mobile electronic device may also be a mobile electronic device without wireless communication capabilities as a handheld electronic game device, digital photograph album, digital camera and the like.

Referring to FIG. 12, there is shown therein a block diagram of an exemplary embodiment of the mobile electronic device 100. The mobile electronic device 100 includes a number of components such as a processor 108 that controls the overall operation of the mobile electronic device 100. Communication functions, including data and voice communications, are performed through a communication subsystem 324. Data received by the mobile electronic device 100 can be decompressed and decrypted by a decoder 326, operating according to any suitable decompression techniques (e.g. YK decompression, and other known techniques) and encryption techniques (e.g. using an encryption technique such as Data Encryption Standard (DES), Triple DES, or Advanced Encryption Standard (AES)). The communication subsystem 324 receives messages from and sends messages to a wireless network 1000. In this exemplary embodiment of the mobile electronic device 100, the communication subsystem 324 is configured in accordance with the Global System for Mobile Communication (GSM) and General Packet Radio Services (GPRS) standards. The GSM/GPRS wireless network is used worldwide. New standards such as Enhanced Data GSM Environment (EDGE) and Universal Mobile Telecommunications Service (UMTS) are believed to have similarities to the network behavior described herein, and it will also be understood by persons skilled in the art that the embodiments described herein are intended to use any other suitable standards that are developed in the future. The wireless link connecting the communication subsystem 324 with the wireless network 1000 represents one or more different Radio Frequency (RF) channels, operating according to defined protocols specified for GSM/GPRS communications. With newer network protocols, these channels are capable of supporting both circuit switched voice communications and packet switched data communications.

Although the wireless network 1000 associated with the mobile electronic device 100 is a GSM/GPRS wireless network in one exemplary implementation, other wireless networks may also be associated with the mobile electronic device 100 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA1000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems. The processor 108 also interacts with additional subsystems such as a Random Access Memory (RAM) 328, a flash memory 330, a display 332, the keyboard 102, a switch 339, an auxiliary input/output (I/O) subsystem 340, a data port 342, a speaker 344, a microphone 346, short-range communications 348, and other device subsystems 350. The flash memory 330 and RAM 328 are examples of a computer readable memory in communication with the processor 108. The memory can store statements and instructions for execution by the processor to perform the method of identifying an intended hard key activation in response to receiving an indication of connection of a key circuit and based on one or more detected capacitance levels, as described and illustrated in the present application Some of the subsystems of the mobile electronic device 100 perform communication-related functions, whereas other subsystems may provide "resident" or on-device functions. By way of example, the keyboard 102 may be used for both communication-related functions, such as entering a text message for transmission over the network 1000, and device-resident functions such as a calculator or task list.

The mobile electronic device 100 can send and receive communication signals over the wireless network 1000 after network registration or activation procedures have been completed. Network access is associated with a subscriber or user of the mobile electronic device 100. To identify a subscriber according to the present embodiment, the mobile electronic device 100 uses a SIM/RUIM card 352 (i.e. Subscriber Identity Module or a Removable User Identity Module) inserted into a SIM/RUIM interface 354 for communication with a network such as the network 1000. The SIM/RUIM card 352 is one type of a conventional "smart card" that can be used to identify a subscriber of the mobile electronic device 100 and to personalize the mobile electronic device 100, among other things. In the present embodiment the mobile electronic device 100 is not fully operational for communication with the wireless network 1000 without the SIM/RUIM card 352.

By inserting the SIM/RUIM card 352 into the SIM/RUIM interface 354, a subscriber can access all subscribed services. Services may include: web browsing and messaging such as e-mail, voice mail, Short Message Service (SMS), and Multimedia Messaging Services (MMS). More advanced services may include: point of sale, field service and sales force automation. The SIM/RUIM card 352 includes a processor and memory for storing information. Once the SIM/RUIM card 352 is inserted into the SIM/RUIM interface 354, it is coupled to the processor 108. In order to identify the subscriber, the SIM/RUIM card 352 can include some user parameters such as an International Mobile Subscriber Identity (IMSI). An advantage of using the SIM/RUIM card 352 is that a subscriber is not necessarily bound by any single physical mobile electronic device. The SIM/RUIM card 352 may store additional subscriber information for a mobile electronic device as well, including datebook (or calendar) information and recent call information. Alternatively, user identification information can also be programmed into the flash memory 330. The mobile electronic device 100 can also be enabled to receive additional memory cards. For example, memory card slots (not shown) can be provided in the mobile electronic device 100 to receive such cards.

The mobile electronic device 100 is a battery-powered device and includes a battery interface 356 for receiving a battery pack containing one or more rechargeable battery cells 358, and associated control circuitry (not shown) that, in some embodiments, can interface with the battery interface 356. The battery pack has a form factor and contact arrangement suited to the particular mobile electronic device. In at least some embodiments, the battery 358 can be a smart battery with an embedded microprocessor. The battery interface 356 is coupled to a regulator (not shown), which assists the battery 358 in providing power V+ to the mobile electronic device 100. Although current technology makes use of a battery, future technologies such as micro fuel cells may provide the power to the mobile electronic device 100.

The mobile electronic device 100 also includes an operating system 360 and software components 362 which are described in more detail below. The operating system 360 and the software components 362 that are executed by the processor 108 are typically stored in a persistent store such as the flash memory 330, which may alternatively be a read-only memory (ROM) or similar storage element (not shown). Those skilled in the art will appreciate that portions of the operating system 360 and the software components 362, such as specific software applications 364, 366, 368, 370 and 372, or parts thereof, may be temporarily loaded into a volatile store such as the RAM 328. Other software components can also be included, as is well known to those skilled in the art.

The subset of software components 362 that control basic device operations, including data and voice communication applications, will normally be installed on the mobile electronic device 320 during its manufacture. Other software applications include a message application 364 that can be any suitable software program that allows a user of the mobile electronic device 100 to send and receive electronic messages. Various alternatives exist for the message application 364 as is well known to those skilled in the art. Messages that have been sent or received by the user are typically stored in the flash memory 330 of the mobile electronic device 100 or some other suitable storage element in the mobile electronic device 100. In at least some embodiments, some of the sent and received messages may be stored remotely from the device 100 such as in a data store of an associated host system that the mobile electronic device 100 communicates with.

The software components 362 can further include a device state module 366, a Personal Information Manager (PIM) 368, and other suitable modules (not shown). The device state module 366 provides persistence, i.e. the device state module 366 ensures that important device data is stored in persistent memory, such as the flash memory 330, so that the data is not lost when the mobile electronic device 100 is turned off or loses power.

The PIM 368 includes functionality for organizing and managing data items of interest to the user, such as, but not limited to, e-mail, contacts, calendar events, voice mails, appointments, and task items. The PIM 368 has the ability to send and receive data items via the wireless network 1000. PIM data items may be seamlessly integrated, synchronized, and updated via the wireless network 1000 with the mobile electronic device subscriber's corresponding data items stored or associated, or both, with a host computer system. This functionality creates a mirrored host computer on the mobile electronic device 330 with respect to such items. This can be particularly advantageous when the host computer system is the mobile electronic device subscriber's office computer system.

The software components 362 also include a connect module 370, and an information technology (IT) policy module 372. The connect module 370 implements the communication protocols that are required for the mobile electronic device 100 to communicate with the wireless infrastructure and any host system, such as an enterprise system, that the mobile electronic device 100 is authorized to interface with.

The connect module 370 includes a set of APIs that can be integrated with the mobile electronic device 100 to allow the mobile electronic device 100 to use any number of services associated with the enterprise system. The connect module 370 allows the mobile electronic device 100 to establish an end-to-end secure, authenticated communication pipe with the host system. A subset of applications for which access is provided by the connect module 370 can be used to pass IT policy commands from the host system to the mobile electronic device 100. This can be done in a wireless or wired manner. These instructions can then be passed to the IT policy module 372 to modify the configuration of the device 100. Alternatively, in some cases, the IT policy update can also be done over a wired connection.

Other types of software applications can also be installed on the mobile electronic device 100. These software applications can be third party applications, which are added after the manufacture of the mobile electronic device 100. Examples of third party applications include games, calculators, utilities, etc.

The additional applications can be loaded onto the mobile electronic device 100 through at least one of the wireless network 1000, the auxiliary I/O subsystem 340, the data port 342, the short-range communications subsystem 248, or any other suitable device subsystem 350. This flexibility in application installation increases the functionality of the mobile electronic device 100 and may provide enhanced on-device functions, communication-related functions, or both. For example, secure communication applications may enable electronic commerce functions and other such financial transactions to be performed using the mobile electronic device 100.

The data port 342 enables a subscriber to set preferences through an external device or software application and extends the capabilities of the mobile electronic device 100 by providing for information or software downloads to the mobile electronic device 100 other than through a wireless communication network. The alternate download path may, for example, be used to load an encryption key onto the mobile electronic device 100 through a direct and thus reliable and trusted connection to provide secure device communication.

The data port 342 can be any suitable port that enables data communication between the mobile electronic device 100 and another computing device. The data port 342 can be a serial or a parallel port. In some instances, the data port 342 can be a USB port that includes data lines for data transfer and a supply line that can provide a charging current to charge the battery 358 of the mobile electronic device 100.

The short-range communications subsystem 348 provides for communication between the mobile electronic device 100 and different systems or devices, without the use of the wireless network 1000. For example, the short-range communications subsystem 348 may include an infrared device and associated circuits and components for short-range communication. Examples of short-range communication standards include standards developed by the Infrared Data Association (IrDA), Bluetooth, and the 802.11 family of standards developed by IEEE.

Synchronization of files and data between the mobile electronic device 100 and another computing device can be achieved over the wireless network 1000, through the short-range communications system 348, or through a direct connection between the data port 342 of the mobile electronic device 100 and the other computing device. Synchronization causes the most recent version of files and data to be mirrored on either the mobile electronic device or the other computing device. As used herein, synchronization also refers to the downloading or uploading of pre-selected files from one device to the other. Synchronization of files and data can be initiated by the user of the device whenever a suitable connection between the mobile electronic device 100 and another computing device, such as a home computer, is detected, or can occur automatically when a connection is detected. A synchronization application, stored in the mobile electronic device 100 or the other computing device, or both, can determine the file and data types to be synchronized, the frequency of synchronization, and other parameters, appropriate to the particular synchronization algorithm implemented by the synchronization application.

In use, a received signal such as a text message, an e-mail message, or web page download is processed by the communication subsystem 324 and input to the processor 108. The processor 108 then processes the received signal for output to the display 332 or alternatively to the auxiliary I/O subsystem 340. A subscriber may also compose data items, such as e-mail messages, for example, using a touch-sensitive overlay (not shown) on the display 332 that is part of a touch screen display, and possibly the auxiliary I/O subsystem 340. The auxiliary I/O subsystem 340 may include devices such as: a mouse, track ball, optical navigation module, infrared fingerprint detector, or a roller wheel with dynamic button pressing capability. A composed item may be transmitted over the wireless network 1000 through the communication subsystem 324.

For voice communications, the overall operation of the mobile electronic device 100 is substantially similar, except that the received signals are output to the speaker 344, and signals for transmission are generated by the microphone 346. Alternative voice or audio I/O subsystems, such as a voice message recording subsystem, can also be implemented on the mobile electronic device 100 Although voice or audio signal output is accomplished primarily through the speaker 344, the display 332 can also be used to provide additional information such as the identity of a calling party, duration of a voice call, or other voice call related information.

In the preceding description, for purposes of explanation, numerous details are set forth in order to provide a thorough understanding of the embodiments described herein. However, it will be apparent to one skilled in the art that these specific details are not required in order to practice the embodiments. In other instances, well-known electrical structures and circuits are shown in block diagram form in order not to obscure the embodiments. For example, specific details are not provided as to whether the embodiments described herein are implemented as a software routine, hardware circuit, firmware, or a combination thereof.

Embodiments described herein can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment described herein. Those of ordinary skill in the art will appreciate that other instructions and operations necessary to implement the described embodiments can also be stored on the machine-readable medium. Software running from the machine-readable medium can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A mobile device, comprising:
   a keyboard including a keypad defining a plurality of hard keys;
   a printed circuit board (PCB) including a plurality of key circuits to detect actuation of the plurality of hard keys;
   a capacitive sensor provided between the keypad and the printed circuit board and arranged to detect a capacitance level on the keypad;
   a processor arranged to identify an intended hard key activation in response to receiving an indication of connection of one of the plurality of key circuits, and when a detected capacitance level on the keypad exceeds a key activation capacitance threshold; and
   a secondary capacitive sensor disposed at a non-keyboard location on the mobile device and arranged to detect a secondary capacitance level at the non-keyboard location,
   wherein the processor is arranged to compare the measured secondary capacitance level at the non-keyboard location to a key activation confirmation threshold, and to identify the key circuit connection as being associated with an intended hard key activation when the measured secondary capacitance level exceeds the key activation confirmation threshold.

2. The mobile device of claim 1 further comprising a light shielding capacitive sensing film providing back light shielding and capacitance detection, the capacitive sensor being provided on a surface of the light shielding capacitive sensing film.

3. The mobile device of claim 2 wherein the capacitive sensor provided on the light shielding capacitive sensing film is implemented by way of a conductive coating.

4. The mobile device of claim 3 wherein the conductive coating comprises an x-channel coating provided on one side of the light shielding capacitive sensing film, and a y-channel coating provided on another side of the light shielding capacitive sensing film.

5. The mobile device of claim 4 wherein the x-channel coating is provided on a keyboard-facing side of the light shielding capacitive sensing film, and the y-channel coating is provided on a PCB-facing side of the light shielding capacitive sensing film.

6. The mobile device of claim 1 wherein the key activation capacitance threshold is about 2 pico Farads greater than a base capacitance, the base capacitance being measured in the absence of actuation of one of the plurality of hard keys by human skin.

7. A method of identifying an intended hard key actuation on a mobile device, the mobile device having a keyboard including a keypad defining a plurality of hard keys, and a printed circuit board including a plurality of key circuits to detect actuation of the plurality of hard keys, the method comprising:
  receiving an indication of connection of a selected one of the plurality of key circuits associated with a selected one of the plurality of hard keys;
  obtaining a measured capacitance level at a keyboard location near the selected hard key;
  comparing the measured capacitance level at the keyboard location to a key activation capacitance threshold;
  identifying the key circuit connection as being associated with an intended hard key activation when the measured capacitance level exceeds the key activation capacitance threshold; and
  if the measured capacitance level is within an uncertainty tolerance below the key activation capacitance threshold:
    obtaining a measured secondary capacitance level at a non-keyboard location of the mobile device;
    comparing the measured secondary capacitance level at the non-keyboard location to a key activation confirmation threshold; and
    identifying the key circuit connection as being associated with an intended hard key activation when the measured secondary capacitance level exceeds the key activation confirmation threshold.

8. The method of claim 7 further comprising, intercepting the key circuit connection before an associated input is passed to an active application.

9. The method of claim 7 further comprising, processing an input associated with the actuation of the selected hard key.

10. A non-transitory computer-readable medium storing statements and instructions for execution by a processor to perform a method of identifying an intended hard key actuation on a mobile device, the mobile device having a keyboard including a keypad defining a plurality of hard keys, and a printed circuit board including a plurality of key circuits to detect actuation of the plurality of hard keys, the method comprising:
  receiving an indication of connection of a selected one of the plurality of key circuits associated with a selected one of the plurality of hard keys;
  obtaining a measured capacitance level at a keyboard location near the selected hard key;
  comparing the measured capacitance level at the keyboard location to a key activation capacitance threshold;
  identifying the key circuit connection as being associated with an intended hard key activation when the measured capacitance level exceeds the key activation capacitance threshold; and
  if the measured capacitance level is within an uncertainty tolerance below the key activation capacitance threshold:
    obtaining a measured secondary capacitance level at a non-keyboard location of the mobile device;
    comparing the measured secondary capacitance level at the non-keyboard location to a key activation confirmation threshold; and
    identifying the key circuit connection as being associated with an intended hard key activation when the measured secondary capacitance level exceeds the key activation confirmation threshold.

11. The non-transitory computer-readable medium of claim 10 wherein the method further comprises, intercepting the key circuit connection before an associated input is passed to an active application.

12. The non-transitory computer-readable medium of claim 10 wherein the method further comprises, processing an input associated with the actuation of the selected hard key.

13. The mobile device of claim 1 further comprising a housing, the non-keyboard location being a location on an outer face of the housing.

* * * * *